US008680946B1

(12) United States Patent
Apostolos et al.

(10) Patent No.: US 8,680,946 B1
(45) Date of Patent: Mar. 25, 2014

(54) TUNABLE TRANSVERSAL STRUCTURES

(75) Inventors: John T. Apostolos, Lyndeborough, NH (US); Judy Feng, Nashua, NH (US); William Mouyos, Windham, NH (US)

(73) Assignee: AMI Research & Development, LLC, Windham, NH (US)

( * ) Notice: Subject to any disclaimer, the term of this patent is extended or adjusted under 35 U.S.C. 154(b) by 0 days.

(21) Appl. No.: 13/431,217

(22) Filed: Mar. 27, 2012

Related U.S. Application Data

(60) Provisional application No. 61/468,275, filed on Mar. 28, 2011, provisional application No. 61/605,833, filed on Mar. 2, 2012.

(51) Int. Cl.
*H03H 7/30* (2006.01)

(52) U.S. Cl.
USPC .......................................... 333/166; 333/140

(58) Field of Classification Search
USPC .................... 333/166, 32, 139, 140, 161, 164
See application file for complete search history.

(56) References Cited

U.S. PATENT DOCUMENTS

| | | | | |
|---|---|---|---|---|
| 5,065,119 | A | 11/1991 | Jachowski | |
| 5,191,304 | A | 3/1993 | Jachowski | |
| 5,796,317 | A | 8/1998 | Bohlman et al. | |
| 6,429,820 | B1 | 8/2002 | Thursby et al. | |
| 6,469,675 | B1 | 10/2002 | Jo et al. | |
| 6,597,321 | B2 | 7/2003 | Thursby et al. | |
| 6,690,331 | B2 | 2/2004 | Apostolos | |
| 6,774,745 | B2 | 8/2004 | Apostolos | |
| 6,987,488 | B1 * | 1/2006 | Chang et al. | 343/767 |
| 7,012,482 | B2 * | 3/2006 | Rawnick et al. | 333/156 |

* cited by examiner

*Primary Examiner* — Robert Pascal
*Assistant Examiner* — Kimberly Glenn
(74) *Attorney, Agent, or Firm* — Cesari and McKenna, LLP

(57) ABSTRACT

A programmable transversal structure that may serve as a filter, or more generally, a transversal network. A pair of time delay elements are implemented using one or more grating control propagation path structures, multilayer waveguides with configurable gaps, or variable impedance meander lines. Electro active actuators responsive to bandwidth, center frequency, and stop band attenuation control inputs control the delay of such elements. Impedance elements are distributed between the time delay elements to provide the desired transversal response.

7 Claims, 9 Drawing Sheets

TUNABLE TRANSVERSAL STRUCTURES

CROSS REFERENCE TO RELATED APPLICATIONS

The present application claims the benefit of U.S. Provisional Application No. 61/468,275, filed on Mar. 28, 2011 and U.S. Provisional Application No. 61/605,833, filed on Mar. 2, 2012.

The entire teachings of the above application(s) are incorporated herein by reference.

BACKGROUND

Impedance matching is the practice of designing the input impedance of an electrical load (or the output impedance of its corresponding source) to maximize power transfer or minimize reflections. The maximum possible power is delivered to the load when the impedance of the load is equal to the complex conjugate of the impedance of the source.

Impedance matching can be provided by various components, including transformers, resistive networks, and filters. Communication systems typically require optimization of operation across a frequency band. Since it is not, in general, possible to achieve perfect impedance matching across multiple frequencies with discrete components, impedance matching networks designed with specific bandwidth most often take the form of a filter. Filters also provide the desired frequency discrimination needed in communication systems.

The electromagnetic spectrum is becoming increasingly crowded due to the proliferation of wireless communication systems. Commercial and military applications both face situations where performance of wireless communications systems is compromised by the proximity of multiple high power systems. The ability to insert a programmable low loss bandstop filter at the input of the receiver of a given system would go a long way toward alleviating the problems presented by high density signal environments.

In addition, wideband, reconfigurable efficient antenna matching at high tuning speeds and high power, particularly at low frequencies where the antennas used are much smaller than a wavelength, is challenging. Relays are limited by speed of operation and size, and solid state switches are fast but may not be able to withstand the high voltages associated with the high Q values encountered in matching small antennas. Also, solid state switches cannot be characterized as simple relays or knife switches because of their parasitic capacitances and power supply lines which affect the operation of high Q components.

SUMMARY

The present disclosure describes varies approaches to implementing transversal filters specifically, and transversal networks, more generally. In preferred embodiments, a transversal structure is provided using transmission line element (s) that are electroactively controlled. One or more impedances are distributed between the transmission line elements to provide weighting that tunes the overall response of the transversal structure.

A transversal filter implementation may consist of a pair of tapped transmission lines with weights applied to the taps. In one embodiment, a grating control propagation path (GCP$^2$) structure provides a way to change the propagation constant of the transmission line. The time delay presented by the transmission line is thus controlled via an electroactive actuator that controls the proximity of grating stubs disposed along its length. Taps with sequentially alternating polarity are disposed along the transmission line, and preferably have a path difference of one-half wavelength at the center frequency of interest. The weights applied to the taps can be further controlled by another electroactive flexture which controls the proximity of the taps to the transmission line.

The transmission line element may also be is provided by an electroactively controlled, reconfigurable variable impedance transmission line (RVITL). The RVITL can take the form of a metallic strip wrapped around a rectangular dielectric block disposed over a ground plane. In a transversal network implementation, electroactive capacitive elements are disposed on the surface of the RVITL. In a transversal filter arrangement, alternating capacitive sections provide weights distributed along the length thereof.

In still other implementations, a travelling wave device with configurable gaps can be used to provide the transmission line element.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

Transversal Filter for Wideband Applications

Figure 1:
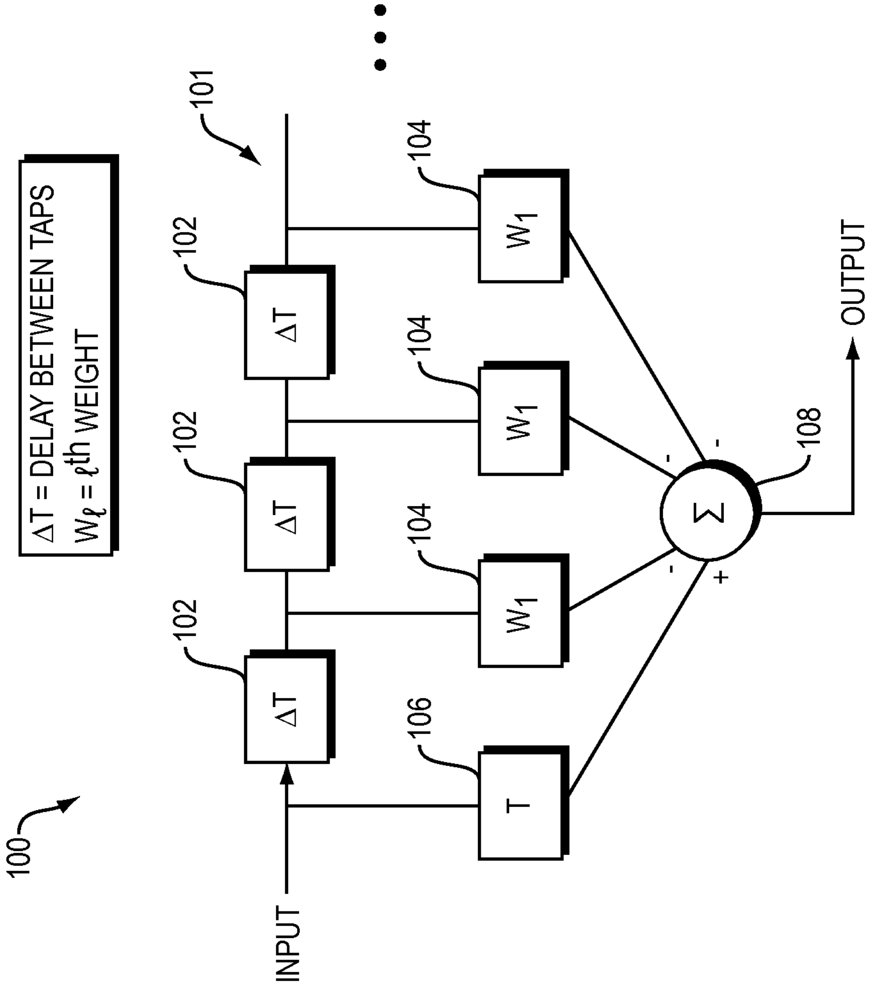
FIG. 1 is a block diagram of a transversal filter implementation.

The general block diagram of a transversal filter 100 is shown is FIG. 1. The block diagram shows in effect a tapped transmission line 101 consisting of a series of delays 102 ΔT with a respective a weighting function $W_1$, $W_2$, $W_3$, . . . applied to a series of taps. The weights 104 map out the impulse response function of the desired frequency response.

Figure 2:
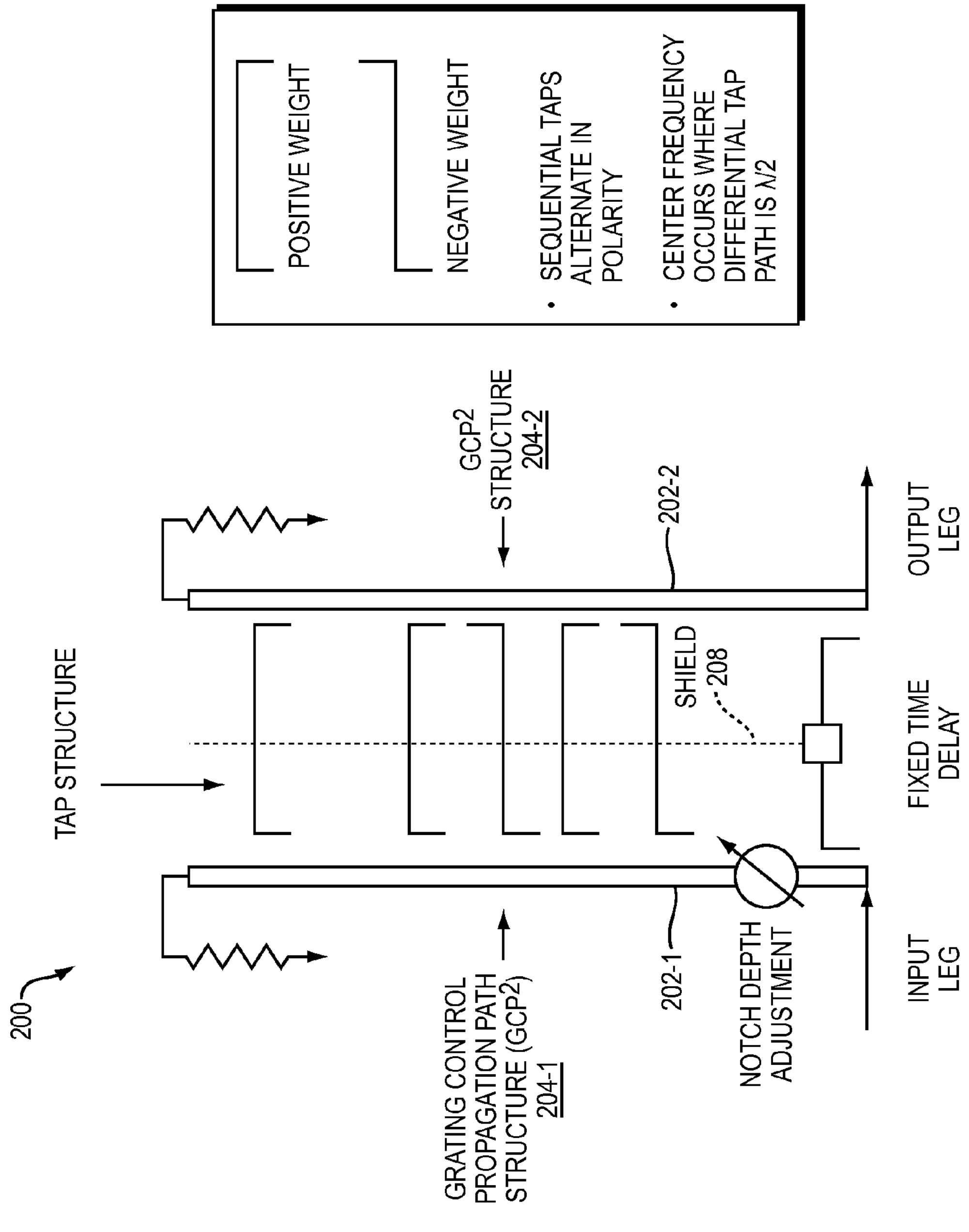
FIG. 2 is a top schematic view of a transmission line with, a Grating Control Propagation Path (GCP$^2$) structure, adjustable delay line, and weighted taps.

To enable a programmable center frequency, bandwidth, and stop band attenuation there must be a way to control the delays 102 and the weights 104 in an analog embodiment. The geometry of one approach to this is seen in FIG. 2. Here a transversal filter 200 is provided by a pair of transmission lines 202-1, 202-2, with each having multiple taps along the length thereof. The transmission lines 202-1, 202-2 may be formed as conductive rods.

A grating control propagation path (GCP2) structure 204-1, 204-2 provides one way to change the propagation constant and thus the delay in each transmission line 202-1, 202-2.

The taps may be implemented as a form of directional coupler as shown, such that positive weight taps are a circuit trace in line with current flow from the input to the output leg, and negative weight is imposed by a trace opposite the flow in the output leg.

In the FIG. 2 implementation, alternating negative and positive weights are applied to the taps, where sequential alternating polarity taps have a path difference of $\lambda/2$ at the center frequency of interest.

Figure 3:
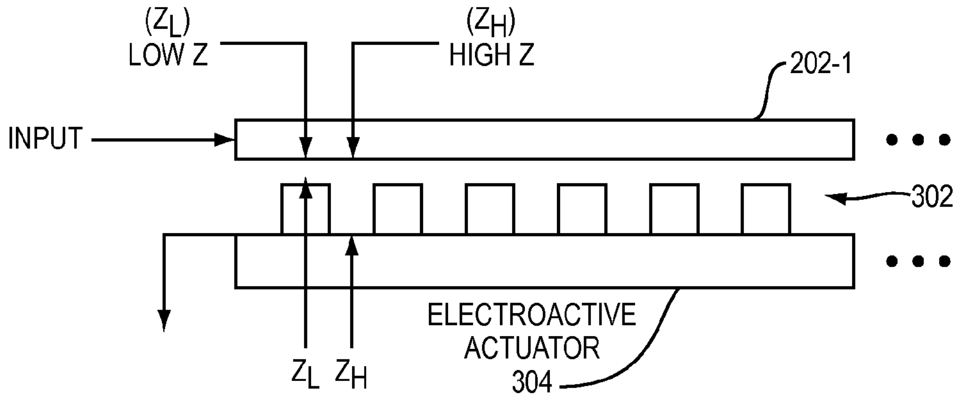
FIG. 3 is a side view of the grating structure.

A programmable time delay is provided by changing the proximity of grounded grating stubs 302 to each transmission line 202. An electro active actuator 304 disposed beneath the transmission line 202-1, and will preferably control the proximity of the grating stubs 302 as seen in the GCP2 structure of FIG. 3. The grating stubs provide alternating impedances ($Z_n$, $Z_H$) along the transmission line structure. The propagation constant in such a periodic ground plane structure transmission line (PEGS-TL) is equal to the propagation of free space multiplied by the square root of the ratio of the high impedance $Z_H$ to the low impedance $Z_n$.

Figure 4:
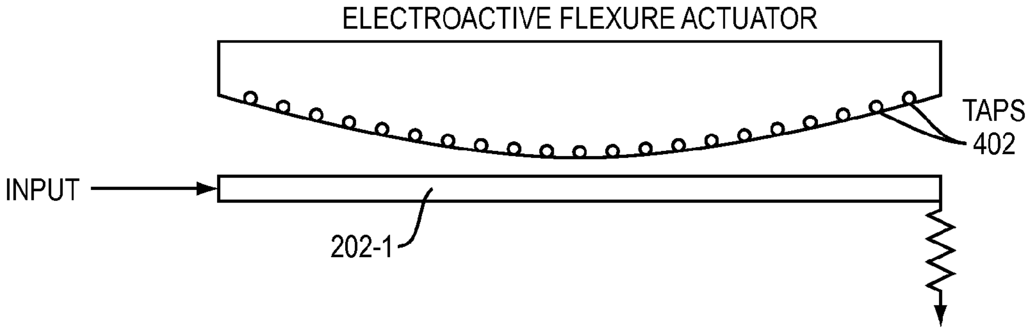
FIG. 4 is a side view of an electroactive actuation weighting function.

The weights of the taps can be controlled by the controlling proximity of tap lines 402 to the respective transmission line as shown in the side view of FIG. 4. The taper of the weights, which determines the bandwidth, can be controlled by disposing the tap lines on another actuator, an electroactive flexure actuator. This second actuator can be disposed above the transmission line 202, as shown in FIG. 4.

In other embodiments (not shown) the center shield 208 can be replaced with a third transmission line structure similar to and disposed between 202-1, 202-2.

Aliasing arises if the bandwidth to be covered is more than about three to one. It thus becomes expedient to break up the input signal band into two bands for a high frequency implementation. For example, to cover 2-18 GHz, one breaks it into: 2-6 GHz and 6-18 GHz bands. In such a case, it should be possible to use two separate transversal filters in series connection to cover the 2-18 GHz instantaneously.

In still other arrangements, the transmission line element 202 may be a waveguide 500 formed of two or more layers. As show in FIG. 5, such a waveguide 500 comprises multiple adjacent layers 504, which may be formed of materials with the same or different dielectric constants. Gaps 502 may be formed between the layers with a gap spacing, S, determined by a control element provided to adjust a size of the gaps 502. The gap spacing control element may be, for example, a piezoelectric, electroactive material or a mechanical position control. Such gaps may further control the propagation constant of the waveguide.

Figure 5:
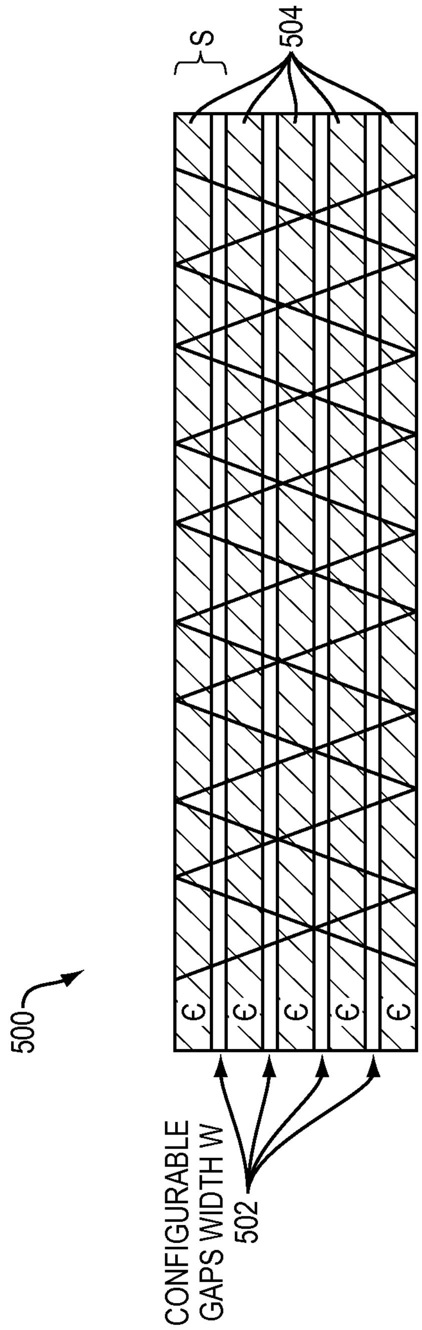
FIG. 5 is a side view of a variable transmission line provided by a multilayer waveguide with configurable gaps.

In this approach, the delay presented by waveguide 500 is controlled by dynamically changing the volume or spacing of the gaps 502. It is equivalent to changing the "effective dielectric constant," causing more or less delay through the waveguide 502. The fields associated with the HE11 mode (the mode operating in a rod type waveguide) are counter propagating waves traversing across the gaps as shown in FIG. 5. The effective dielectric constant change is independent of frequency as long as the gap spacing, S, is less than ¼ wavelength.

Generalization to Transversal Networks

Distributed networks are ideally suited to mitigate the high voltages because of their ability to distribute the voltage gradients. Variable impedance transmission line technology has been used in so called meander line loaded antennas to mitigate these deleterious effects. The teachings above for transversal filters can be generalized to encompass transversal networks suitable for this use. Thus a high power, distributive tunable transversal network can be implemented using variable impedance transmission line elements which are electroactively controlled.

Figure 6:
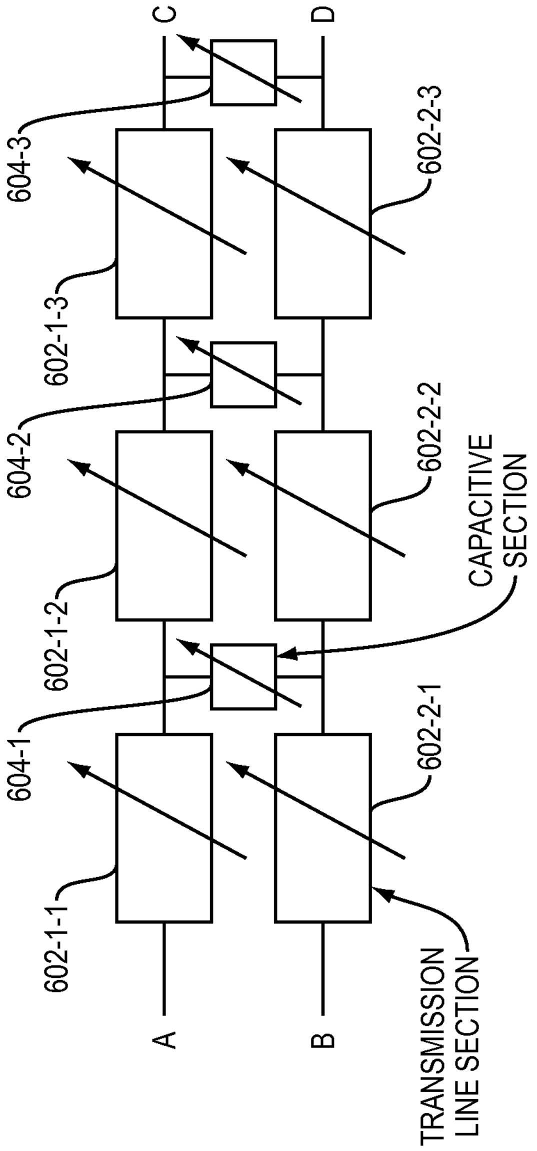
FIG. 6 is a high level block diagram of a tunable transversal network.

One possible distributive transversal network topology is seen in FIG. 6. It offers the flexibility of ladder networks and the benefits of distributive networks. The transmission line sections 602-1-1, . . . , 602-2-3 are lengths of reconfigurable variable impedance transmission lines (RVITL) while the capacitive sections 604-1, . . . , 604-3 are distributive tunable capacitors.

Figure 7:
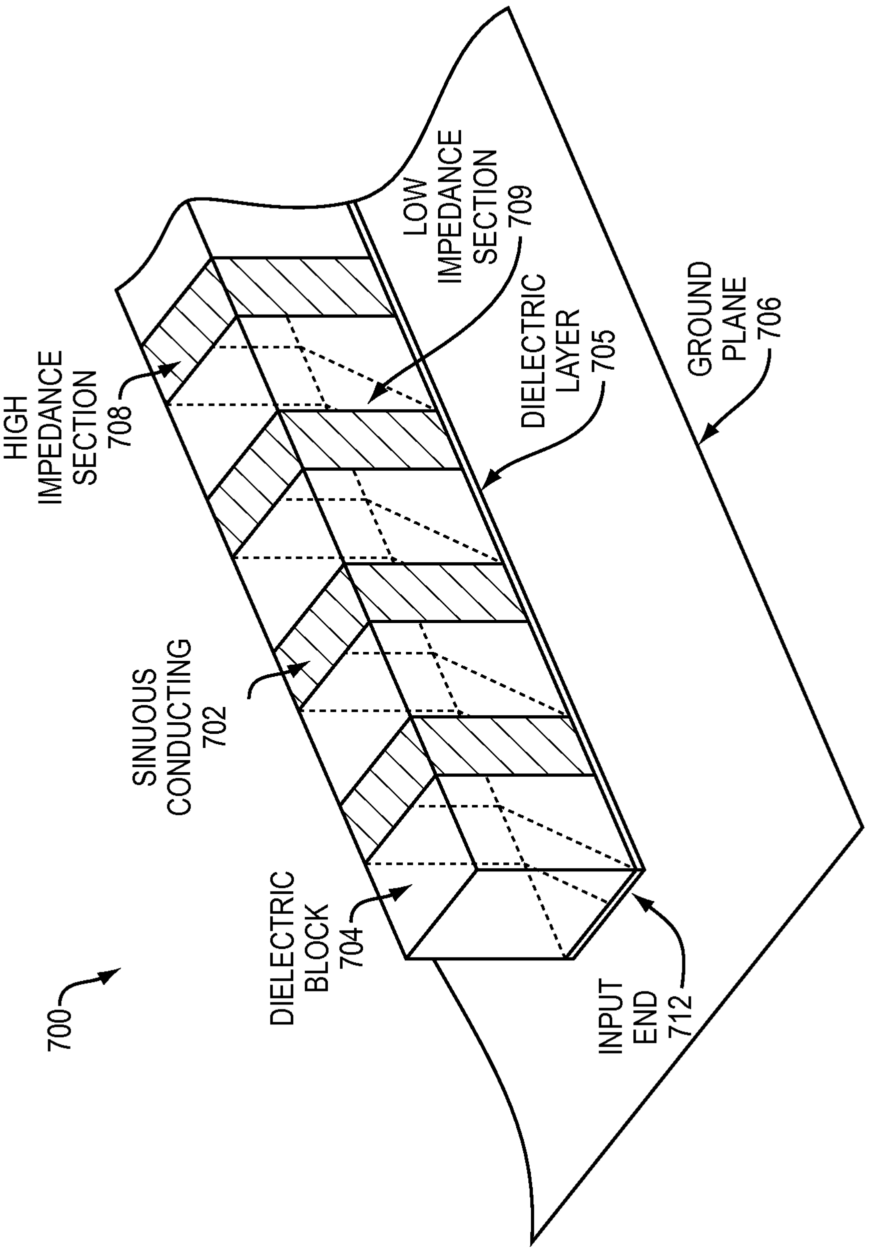
FIG. 7 is a variable impedance transmission line formed from a sinuous conducting strip and with capacitive weights.

The basic geometry of the RVITL 700 is shown in FIG. 7. The transmission line is a metallic strip 702 wrapped around a rectangular solid dielectric block 704 resting on an insulated ground plane 706. The metallic strip 702 is seen to consist of alternating high 708 and low 709 impedance sections relative to the ground plane 706.

FIG. 7 shows a uniform RVITL structure along the primary axis of the RVITL, that is, the high 708 and low 709 impedance sections are spaced uniformly along the axis. In a wideband RVITL certain features, including the cross section of the dielectric block 704, scale log periodically along the axis, with the smaller (higher frequency) features located at the input end 712.

Figure 8:
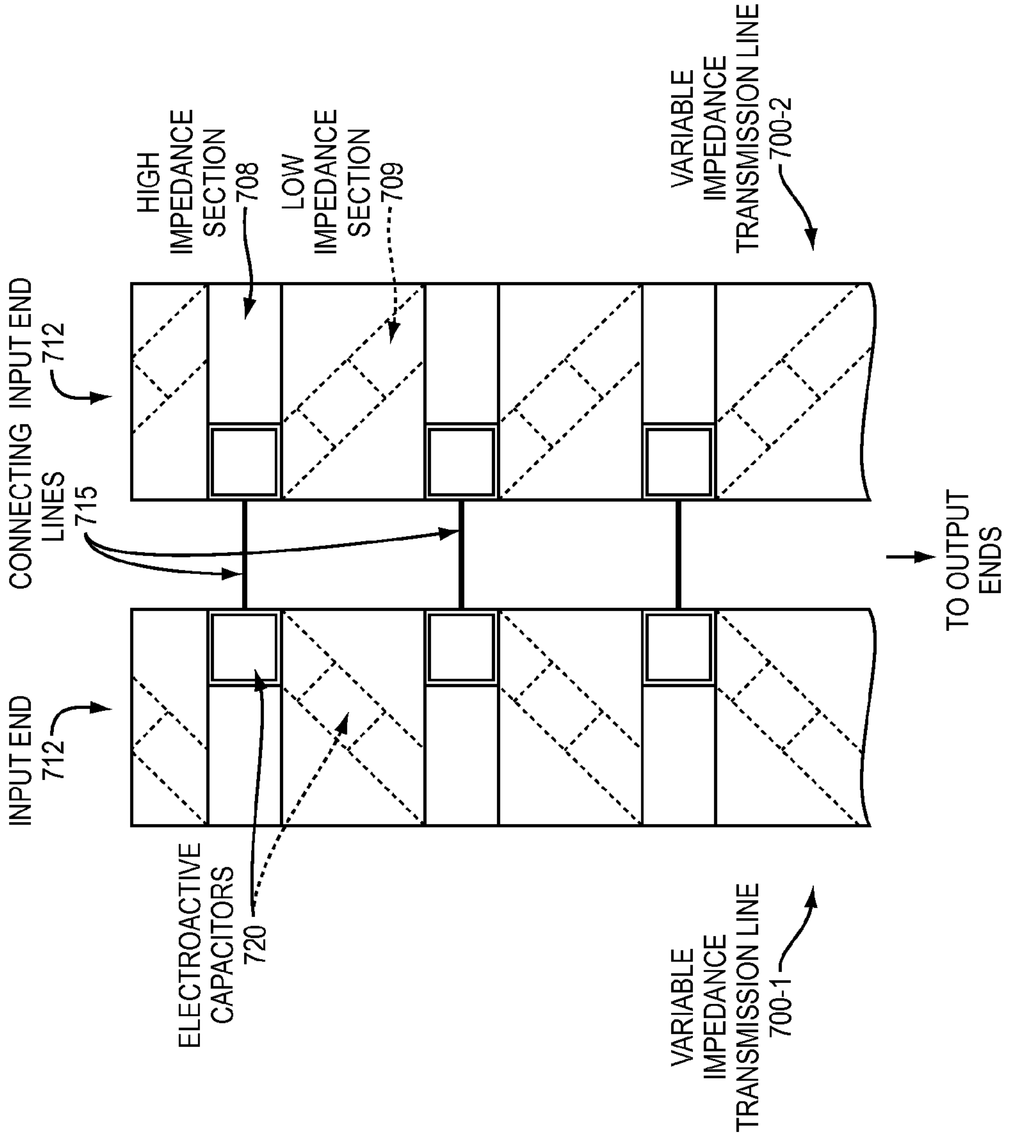
FIG. 8 is a top view of the transversal structure of FIG. 7.

The transversal topology network is achieved by placing two RVITL structures 700-1, 700-2 side by side and connecting them with electroactive capacitive sections as shown in FIG. 8. Connecting lines 715 between the electroactive capacitive sections provide adjustable coupling between the two RVITLs 700-1, 700-2. The capacitance of the capacitive sections and the capacitance (i.e. impedance) of the low impedance sections are controlled by electro active actuators.

Figure 9:
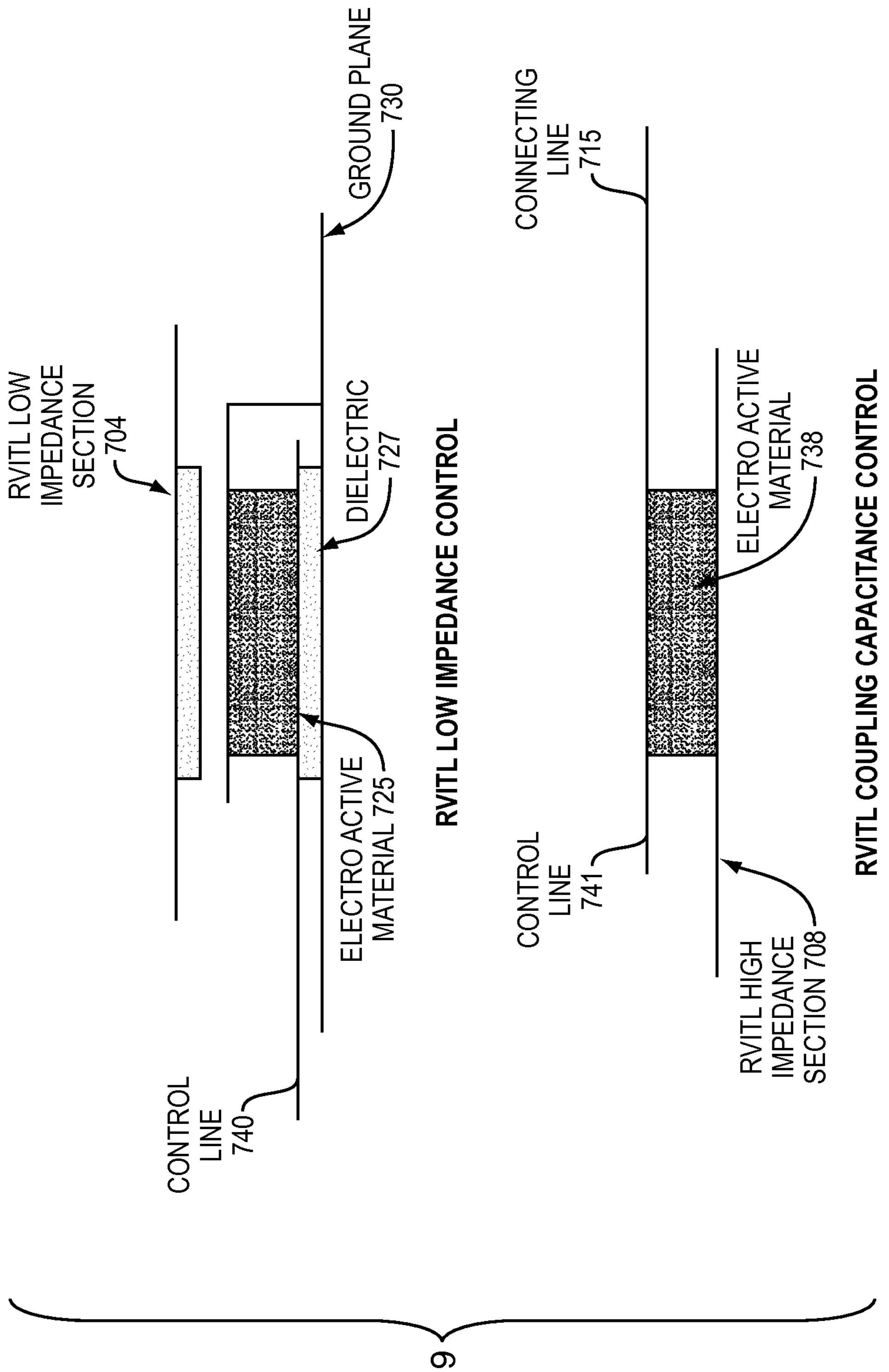
FIG. 9 is a side view showing electroactive actuators for the transversal structure of FIG. 7.

FIG. 9 shows one possible electroactive capacitor control arrangement. A capacitive structure provided by a low impedance section 709 is placed adjacent an electroactive material 725 to control spacing with respect to a dielectric 727 positioned over a ground plane 730. Controlling the resulting low impedance section 709 value effectively controls the propagation constant and thus the effective length of the transmission line sections 700 since the propagation constant of the line sections is proportional to the square root of the high impedance 708 divided by the low impedance 709. Controlling the capacitive sections 708, 709 enables the specific coupling capacitance between the RVITL's 700 to be varied.

The electroactive control lines for the capacitive sections may be snaked along the metallic strip 702 of the RVITL 700 (not shown), converging at the input end 712 of the strip. At the input end, the control wires can be wound around a toroid ferrite core to isolate the control wires from the input end 712. The electro active control lines 740 for the low impedance sections 709 are at RF ground potential. The RF power limitation depends primarily upon the dielectric insulation between the low impedance section and ground.

Figure 10:
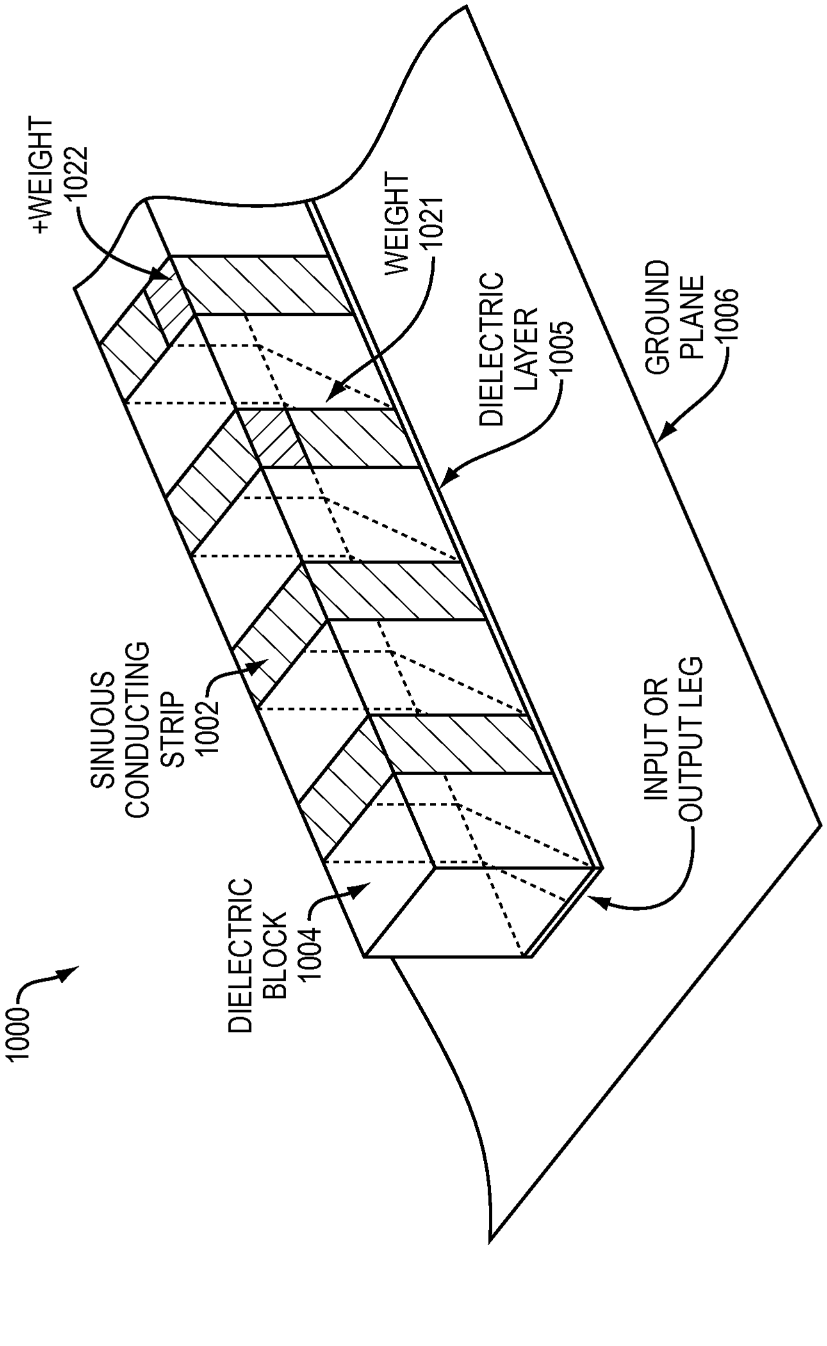
FIG. 10 is a transversal filter implementation using a sinuous conductive strip.

FIG. 10 is an implementation of a transversal filter 1000 using an RVITL topology similar to that of FIG. 7. Here a sinuous strip 1002 is formed around a dielectric block 1004 disposed over a ground plane 1006 and dielectric layer 1005. An adjustable positive weight can be provided by electroactive capacitor 1022 disposed on a top surface; a negative weight can be imposed by an electroactive capacitor 1021 disposed on a side thereof (e.g., at 90 degrees to the positive weight).

The many degrees of freedom available with the array of electro actively controlled specific propagation constants and specific coupling capacitances allied with the use of techniques combining systematic search and gradient based optimization provides the means to achieve robust, high power, agile matching networks and adaptive filters.

While this invention has been particularly shown and described with references to example embodiments thereof, it will be understood by those skilled in the art that various changes in form and details may be made therein without departing from the scope of the invention encompassed by the appended claims.

What is claimed is:

1. An apparatus comprising:

two or more transmission line elements disposed adjacent one another, at least one of which having a variable impedance;

an electro active controlled impedance component disposed adjacent at least one of the transmission line elements, to further effect adjustment of a delay characteristic of the at least one transmission line element; and an alternating series of positive and negative weights disposed between the two or more transmission line elements, to provide a transversal filter.

2. An apparatus comprising:

two or more transmission line elements disposed adjacent one another, at least one of which having a variable impedance;

an electro active controlled impedance component disposed adjacent at least one of the transmission line elements, to further effect adjustment of a delay characteristic of the at least one transmission line element; and wherein at least one of the transmission line elements is provided by a multilayer waveguide having configurable gaps between the layers.

3. The apparatus of claim 1 or claim 2 and further comprising:

one or more grating control propagation path structures, disposed adjacent at least one of the transmission line elements, to control a time delay of said at least one transmission line element; and one or more electroactive actuators disposed adjacent at least one of the grating control propagation path structures, and operable to control a proximity of the respective grating control propagation path structures to the at least one transmission line element.

4. The apparatus of claim 1 or claim 2 further comprising: one or more tap lines, disposed adjacent at least one of the transmission lines; one or more electroactive flex actuators, each disposed adjacent at least one corresponding tap line, to taper a weighting applied to the tap lines.

5. The apparatus of claim 1 or claim 2 wherein the at least one transmission line element is an elongated dielectric block having a sinuous conducting strip winding around external surfaces thereof; and the electo active controlled impedance component is disposed adjacent the sinuous conducting strip.

6. The apparatus of claim 5 further comprising:

a transversal network, comprising fixed low impedance sections and fixed high impedance sections disposed adjacent the conductive strip.

7. The apparatus of claim 5 wherein a transversal filter is provided by two electroactively controlled impedance components disposed such that a first electroactively controlled impedance is disposed on a first surface of a waveguide to provide a negative weight, and a second electroactively controlled impedance is disposed on a second side of the waveguide to provide a positive weight.

* * * * *